(12) United States Patent
Irisawa

(10) Patent No.: US 12,142,504 B2
(45) Date of Patent: Nov. 12, 2024

(54) SUBSTRATE HOLDING DEVICE

(71) Applicant: NISSIN ELECTRIC CO., LTD., Kyoto (JP)

(72) Inventor: Kazuhiko Irisawa, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 947 days.

(21) Appl. No.: 17/253,127

(22) PCT Filed: Jun. 18, 2019

(86) PCT No.: PCT/JP2019/024073
§ 371 (c)(1),
(2) Date: Dec. 17, 2020

(87) PCT Pub. No.: WO2019/244880
PCT Pub. Date: Dec. 26, 2019

(65) Prior Publication Data
US 2021/0292106 A1    Sep. 23, 2021

(30) Foreign Application Priority Data

Jun. 20, 2018  (JP) .................................. 2018-117145

(51) Int. Cl.
*H01L 21/677* (2006.01)
*B23P 11/00* (2006.01)
(Continued)

(52) U.S. Cl.
CPC ............ *H01L 21/677* (2013.01); *B23P 11/00* (2013.01); *B25B 11/00* (2013.01); *B65G 49/061* (2013.01);
(Continued)

(58) Field of Classification Search
CPC ........ B25B 11/00; B23P 11/00; B65G 49/061; B65G 49/063; B65G 49/066;
(Continued)

(56) References Cited

U.S. PATENT DOCUMENTS

| | | | |
|---|---|---|---|
| 6,612,014 B1 | 9/2003 | Donoso et al. | |
| 10,332,778 B2 * | 6/2019 | Pohl | ................. H01L 21/68742 |
| 2011/0163196 A1 | 7/2011 | Wang | |

FOREIGN PATENT DOCUMENTS

| | | |
|---|---|---|
| CN | 103108275 | 5/2013 |
| CN | 104378725 | 2/2015 |

(Continued)

OTHER PUBLICATIONS

Machine translation of KR-20070092686-A (Year: 2007).*
(Continued)

*Primary Examiner* — Robert F Neibaur
(74) *Attorney, Agent, or Firm* — JCIPRNET

(57) ABSTRACT

A substrate holding device includes: a frame body on which a substrate transferred by a transfer device is mounted, and a substrate delivery mechanism for delivering, to the frame body, the substrate transferred to the above of the frame body by the transfer device. The substrate delivery mechanism includes: a support pin arranged below the frame body, a support pin advancing/retreating mechanism for advancing and retreating the support pin between a support pin lifting/lowering position set on a lower side inside the frame body and a support pin retracting position set outside the frame body, and a support pin lifting/lowering mechanism by which the support pin arranged in the support pin lifting/lowering position by the support pin advancing/retreating mechanism is lowered after being lifted so as to pass through the interior of the frame body and support the substrate.

9 Claims, 7 Drawing Sheets

(51) Int. Cl.
   *B25B 11/00* (2006.01)
   *B65G 49/06* (2006.01)
   *H01L 21/683* (2006.01)
   *H01L 21/687* (2006.01)

(52) U.S. Cl.
   CPC ...... *H01L 21/683* (2013.01); *H01L 21/68728* (2013.01); *H01L 21/68742* (2013.01); *B65G 2201/022* (2013.01)

(58) Field of Classification Search
   CPC ............. H01L 21/687; H01L 21/68714; H01L 21/68728; H01L 21/68742; H01L 21/68785; H01L 21/68707; H01L 21/67742; H01L 21/67778; B24B 37/345; B25J 11/0095
   See application file for complete search history.

(56) References Cited

FOREIGN PATENT DOCUMENTS

| | | | | |
|---|---|---|---|---|
| CN | 104538345 | | 4/2015 | |
| CN | 104538345 A | * | 4/2015 | ....... H01L 21/68721 |
| CN | 107342255 | | 11/2017 | |
| JP | 2002334922 A | * | 11/2002 | |
| JP | 12002334922 | | 11/2002 | |
| JP | 2003270155 | | 9/2003 | |
| JP | 2008035393 | | 2/2008 | |
| JP | 2008204996 | | 9/2008 | |
| JP | 2009055046 | | 3/2009 | |
| JP | 2009055046 A | * | 3/2009 | |
| JP | 2010062317 | | 3/2010 | |
| JP | 2010098048 | | 4/2010 | |
| KR | 20070092686 A | * | 9/2007 | ....... H01L 21/67098 |
| KR | 20140124026 | | 10/2014 | |
| KR | 101525661 | | 6/2015 | |
| KR | 101770221 | | 8/2017 | |
| KR | 101770221 B1 | * | 8/2017 | ....... H01L 21/68714 |
| TW | 201806072 | | 2/2018 | |

OTHER PUBLICATIONS

Machine translation of JP-2009055046-A (Year: 2009).*
Machine translation of CN-104538345-A (Year: 2015).*
Machine translation of KR-101770221-B1 (Year: 2017).*
Machine translation of JP-2002334922-A (Year: 2002).*
"Office Action of China Counterpart Application", issued on Sep. 9, 2023, with English translation thereof, p. 1-p. 18.
Office Action of China Counterpart Application, with English translation thereof, issued on Mar. 13, 2024, pp. 1-13.
"Office Action of China Counterpart Application", issued on Jun. 4, 2024, with English translation thereof, p. 1-p. 20.
"Office Action of Korea Counterpart Application", issued on Jun. 10, 2022, with English translation thereof, p. 1-p. 10.
"Office Action of Taiwan Counterpart Application", issued on Dec. 2, 2020, with English translation thereof, p. 1-p. 17.
"International Search Report (Form PCT/ISA/210)" of PCT/JP2019/024073, mailed on Jul. 30, 2019, with English translation thereof, pp. 1-4.

* cited by examiner

SUBSTRATE HOLDING DEVICE

CROSS-REFERENCE TO RELATED APPLICATION

This application is a 371 of international application of PCT application serial no. PCT/JP2019/024073, filed on Jun. 18, 2019, which claims the priority benefit of Japan application no. 2018-117145, filed on Jun. 20, 2018. The entirety of each of the above-mentioned patent applications is hereby incorporated by reference herein and made a part of this specification.

BACKGROUND

Technical Field

The present invention relates to a substrate holding device.

Related Art

As a mechanism for transferring a substrate used for a display or the like to a processing chamber, in Patent Literature 1, a mechanism is disclosed in which a plurality of support pins are protruded after a substrate is transferred onto a substrate mount table in a processing chamber by a transfer device, and the substrate is delivered from the transfer device to the substrate mount table by lifting and lowering the plurality of support pins.

However, in the mechanism disclosed in Patent Literature 1, protruding positions of the plurality of support pins on the substrate mount table are predetermined, and thus when a size, a material or the like of the substrate to be processed is changed, the position for supporting the substrate after the change by the plurality of support pins cannot be changed. Therefore, there is a problem that the substrate may be bent when the substrate after the change is to be supported by the plurality of support pins. Meanwhile, if the material of the substrate is changed, the center of gravity of the substrate is changed even if the substrate is the same size, and thus it is necessary to appropriately readjust the position for supporting the substrate by the support pins.

LITERATURE OF RELATED ART

Patent Literature

Patent literature 1: Japanese Patent Laid-Open No. 2008-235393

SUMMARY

Problems to be Solved

Therefore, a main object of the present invention is to provide a substrate holding device which is capable of adjusting a position for supporting a substrate in accordance with the substrate after a change even when a size, a material or the like of the substrate to be processed is changed.

Means to Solve Problems

That is, the substrate holding device according to the present invention includes: a frame body on which a substrate transferred by a transfer device is mounted; and a substrate delivery mechanism for delivering, to the frame body, the substrate transferred to the above of the frame body by the transfer device. The substrate delivery mechanism includes: a support pin arranged below the frame body; a support pin advancing/retreating mechanism for advancing and retreating the support pin between a support pin lifting/lowering position set on a lower side inside the frame body and a support pin retracting position set outside the frame body; and a support pin lifting/lowering mechanism by which the support pin arranged in the support pin lifting/lowering position by the support pin advancing/retreating mechanism is lowered after being lifted so as to pass through the interior of the frame body and support the substrate.

In this case, the support pin can be moved in and out of the frame body by the support pin advancing/retreating mechanism, and thus a position where the substrate is supported by the support pin can be freely adjusted within the movement range. Thereby, even when the size, the material or the like of the substrate is changed, the position where the substrate is supported by the support pin can be appropriately readjusted in accordance with the substrate after the change.

In addition, by adopting the substrate delivery mechanism, even if there are a plurality of frame bodies arranged in a multi-stage shape and the support pins are arranged below each of the frame bodies, when the frame body on which the substrate is mounted is transferred, each support pin can be retracted to a position which does not interfere with the transfer operation by the support pin advancing/retreating mechanism.

In this case, the support pins arranged below each frame body may be driven by the support pin advancing/retreating mechanism and the support pin lifting/lowering mechanism in common. In this case, there is one mechanism for driving the support pins arranged below each frame body, and the substrate holding device can be miniaturized.

Furthermore, when the substrate is processed in a processing chamber, in order to prevent dust and the like from adhering to the substrate, the frame body on which the substrate is mounted may be transferred to the processing chamber in a vertically erected state. Therefore, a frame body erecting mechanism for erecting each frame body on which the substrate is mounted into the vertical state may be further included.

Even in this case, by adopting the substrate delivery mechanism, each support pin can be retraced to a position which does not interfere with the erecting operation by the support pin advancing/retreating mechanism when the frame body is erected from a horizontal state to the vertical state by the frame body erecting mechanism.

As a specific configuration of the substrate delivery mechanism, the support pin advancing/retreating mechanism may swivel the support pin in a horizontal direction.

In addition, as a more specific configuration of the substrate delivery mechanism, the support pin advancing/retreating mechanism and the support pin lifting/lowering mechanism may drive the support pin via a common support column installed outside the frame body and an arm having a length extending from the support column to at least the lifting/lowering position, the support pin advancing/retreating mechanism may rotate the support column to swivel the support pin, and the support pin lifting/lowering mechanism may lift and lower the support column to lift and lower the support pin.

In this case, the support pin advancing/retreating mechanism and the support pin lifting/lowering mechanism can be structures in which the common support column is driven, and thus the drive device of the two mechanisms can be integrated on, for example, a lower side of the support column or the like. Thereby, the substrate holding device can be miniaturized, and maintainability is also improved.

In addition, when the frame body erecting mechanism is included as described above, it is preferable to further include a clamp mechanism for clamping and holding the substrate mounted on the frame body between the clamp mechanism and the frame body.

Thereby, even if the frame body on which the substrate is mounted is vertically erected by the frame body erecting mechanism, because the substrate is held on the frame body by the clamp mechanism, the substrate can be prevented from falling off from the frame body.

In addition, the specific configuration of the clamp mechanism may include: a clamp piece which opens and closes so as to clamp the substrate mounted on the frame body between the clamp piece and the frame body; and a clamp holding mechanism for holding the clamp piece in a closed state with respect to the frame body.

In addition, the clamp holding mechanism may include a magnet arranged on either the frame body or the clamp piece and a magnetic body arranged on the other.

In this case, the clamp mechanism has a structure in which a force for holding the clamp piece in the closed state with respect to the frame body is given by attraction due to a magnetic force, and thus the structure can be simplified, the clamp mechanism can be easily assembled, and productivity is improved.

In addition, when the clamp mechanism is installed in the frame body, it is preferable to further include a clamp release mechanism for releasing the closed state of the clamp piece.

Moreover, as a specific configuration of the clamp release mechanism, the frame body may have a penetration hole, and the clamp release mechanism may further include: a push-up pin arranged below the frame body; a push-up pin advancing/retreating mechanism for advancing and retreating the push-up pin between a push-up pin lifting/lowering position set on a lower side of the penetration hole of the frame body and a push-up pin retracting position set outside the frame body; and a push-up pin lifting/lowering mechanism which lifts the push-up pin arranged in the push-up pin lifting/lowering position by the push-up pin advancing/retreating mechanism so as to insert the push-up pin into the penetration hole of the frame body and push up the clamp piece, and then lowers the push-up pin.

In this case, similar to the case of the substrate delivery mechanism, when the frame body is erected from the horizontal state to the vertical state by the frame body erecting mechanism, each push-up pin can be retreated by the push-up pin advancing/retreating mechanism so as not to interfere with the erecting operation.

Effect

According to the substrate holding device having the configuration as described above, even when the size, the material or the like of the substrate to be processed is changed, the position for supporting the substrate can be adjusted in accordance with the substrate after the change.

DESCRIPTION OF THE EMBODIMENTS

A substrate holding device according to the present invention is described below based on the drawings.

The substrate holding device according to the present invention is used to, for example, transfer a substrate used for a display into a processing chamber when the substrate is processed.

Figure 1:
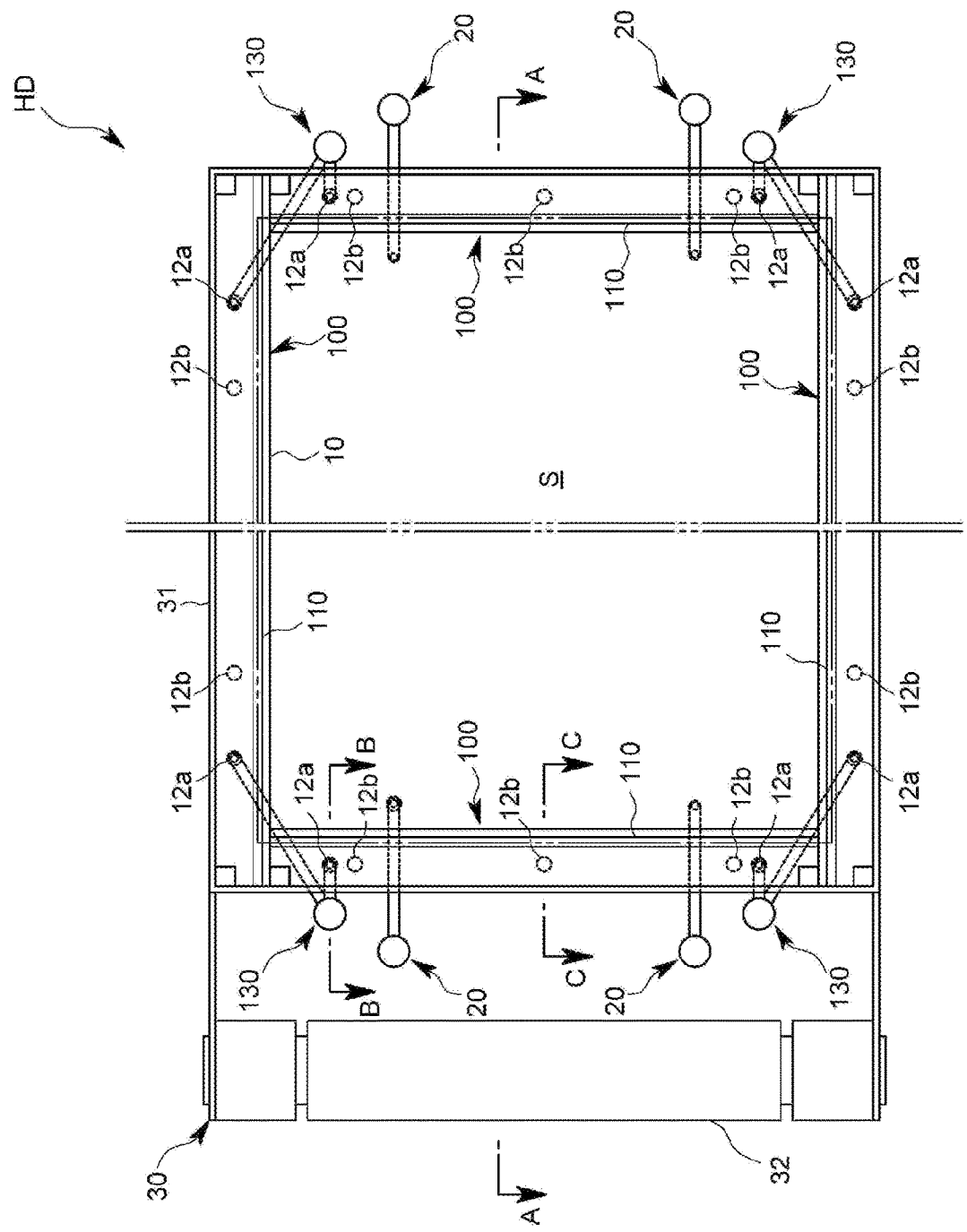
FIG. 1 is a plan view schematically showing a substrate holding device according to an embodiment.
Figure 2:
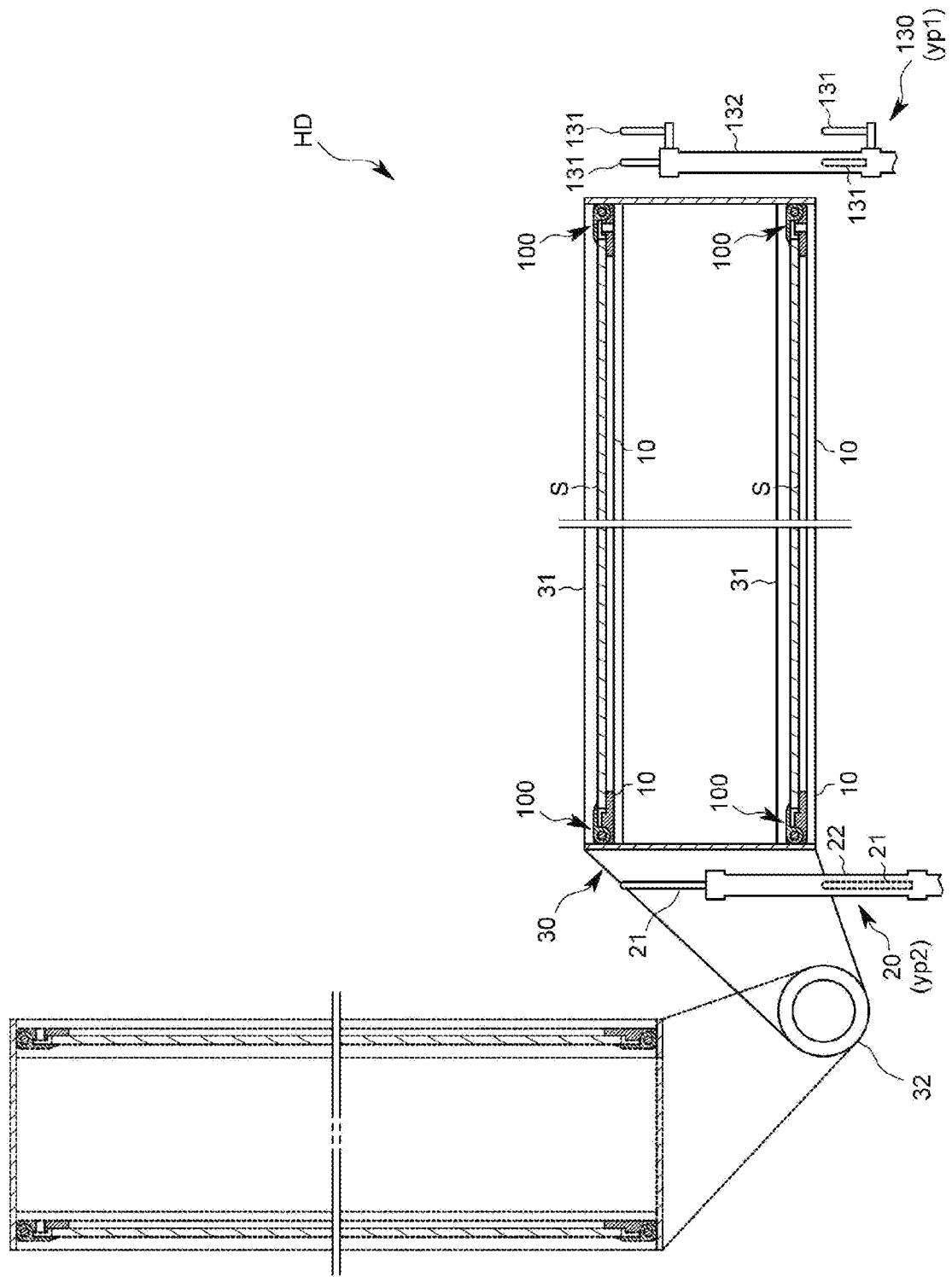
FIG. 2 is a cross-sectional view schematically showing the substrate holding device according to the embodiment along line A-A.

<Embodiment> As shown in FIG. 1 and FIG. 2, a substrate holding device HD according to the embodiment includes a plurality of frame bodies 10 on which substrates S transferred by a transfer device TD are mounted, substrate delivery mechanisms 20 for delivering, to the frame body 10, the substrate S transferred to the above of the frame body 10 by the transfer device TD, and a frame body erecting mechanism 30 for erecting the frame body 10 on which the substrate S is mounted by the substrate delivery mechanism 20.

Each of the plurality of frame bodies 10 has a rectangular frame shape, and is formed into the same size. Besides, each frame body 10 is disposed in an up-down direction at intervals from each other and is arranged in multiple stages. Moreover, there are two frame bodies 10 of the embodiment, and the two frame bodies 10 are arranged in two stages.

Figure 3:
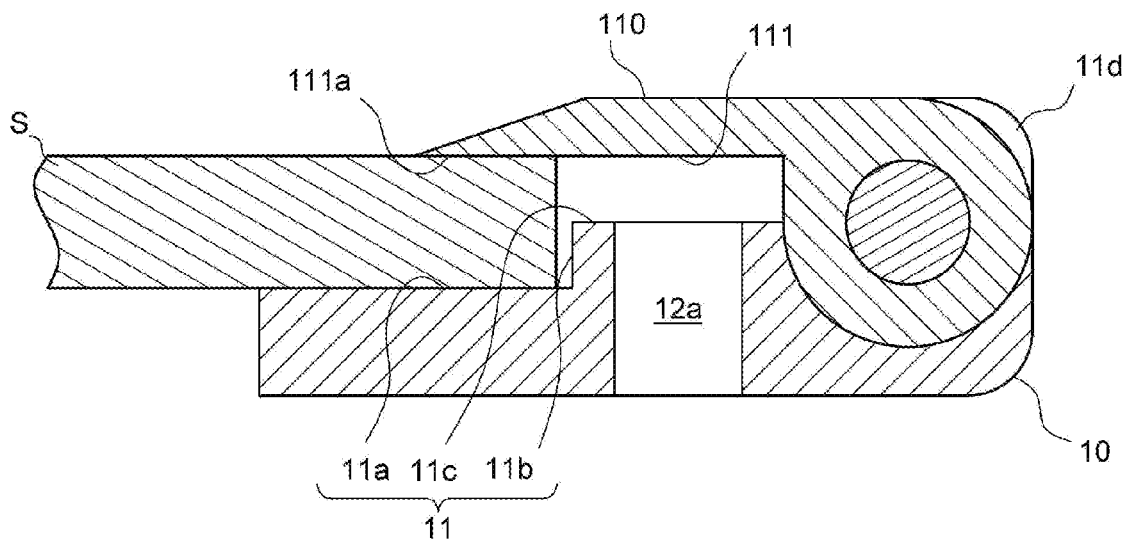
FIG. 3 is an enlarged cross-sectional view schematically showing a clamp mechanism according to the embodiment along line B-B.
Figure 4:
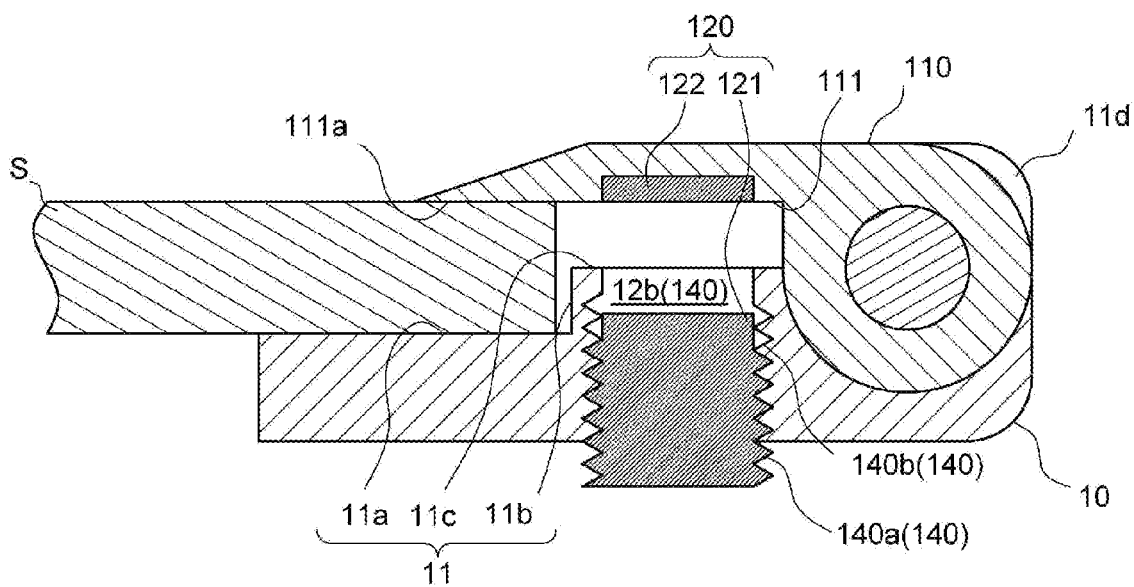
FIG. 4 is an enlarged cross-sectional view schematically showing the clamp mechanism according to the embodiment along line C-C.

Specifically, as shown in FIG. 3 and FIG. 4, an upper surface 11 of the frame body 10 is provided with an abutting surface 11a against which a lower surface of the substrate S abuts, an facing surface 11b which rises from the abutting surface 11a and faces an end surface of the substrate S mounted on the abutting surface 11a, and an extending surface 11c extending from the facing surface 11b toward a side opposite to the abutting surface 11a. Moreover, the facing surface 11b plays a role of regulating a position deviation of the substrate S mounted on the abutting surface 11a.

In addition, as shown in FIG. 1 and FIG. 2, the frame body 10 includes a clamp mechanism 100 for holding the substrate S mounted on the frame body 10. Besides, the clamp mechanism 100 includes a clamp piece 110 which opens and closes so as to clamp the substrate S mounted on the frame body 10, a clamp holding mechanism 120 for holding the clamp piece 110 in a closed state with respect to the frame body 10, and a clamp release mechanism 130 for releasing the closed state of the clamp piece 110 with respect to the frame body 10.

In addition, each edge of the frame body 10 is provided with penetration holes 12a which penetrate from a surface facing the clamp piece 110 to the opposite surface on both end sides, and insertion holes 12b which penetrate from the surface facing the clamp piece 110 to the opposite surface near the center. Specifically, each of the penetration holes 12a and the insertion holes 12b penetrates from the extending surface 11c to the opposite surface of the extending surface 11c. Moreover, the plurality of insertion holes 12b are arranged intermittently along a longitudinal direction of each edge.

As shown in FIG. 3 and FIG. 4, the clamp piece 110 is rotatably supported by a hinge portion 11d arranged on the extending surface 11c of the frame body 10, and the clamp piece 110 opens and closes with respect to the frame body 10 with an axis of the hinge portion 11d as a fulcrum. Moreover, a lower surface 111 of the clamp piece 110 (a surface directed toward the frame body 10 side) extends to a position facing the abutting surface 11a of the frame body 10, and an distal end side facing the abutting surface 11a is an abutting surface 111a abutting against the other surface (an upper surface) of the substrate S.

As shown in FIG. 4, the clamp holding mechanism 120 holds the clamp piece 110 in the closed state with respect to the frame body 10 by attracting the frame body 10 and the clamp piece 110 to each other with a magnetic force. Specifically, the clamp holding mechanism 120 includes a magnet 121 arranged in the frame body 10, and a magnetic body 122 arranged in the clamp piece 110. Moreover, the magnet 121 avoids the abutting surface 11a of the frame body 10 and is inserted into and held in the insertion hole 12b arranged on the extending surface 11c side which does not abut against the substrate S, and the magnetic body 122 is arranged on the lower surface 111 of the clamp piece 110 so as to face the magnet 121.

In addition, the clamp holding mechanism 120 includes a distance adjusting mechanism 140 for adjusting a distance between the magnet 121 and the magnetic body 122 when the clamp piece 110 is in the closed state with respect to the frame body 10. Specifically, the distance adjusting mechanism 140 is a part of the configuration of the insertion hole 12b arranged in the frame body 10, and is inserted into the insertion hole 12b in a manner that the magnet 121 can advance and retreat with respect to the magnetic body 122. More specifically, the distance adjusting mechanism 140 includes a male screw portion 140a arranged on an outer surface of the magnet 121 and a female screw portion 140b arranged on an inner surface of the insertion hole 12b, and the magnet 121 can move in the insertion hole 12b by rotating the magnet 121 with respect to the insertion hole 12b.

Figure 5:
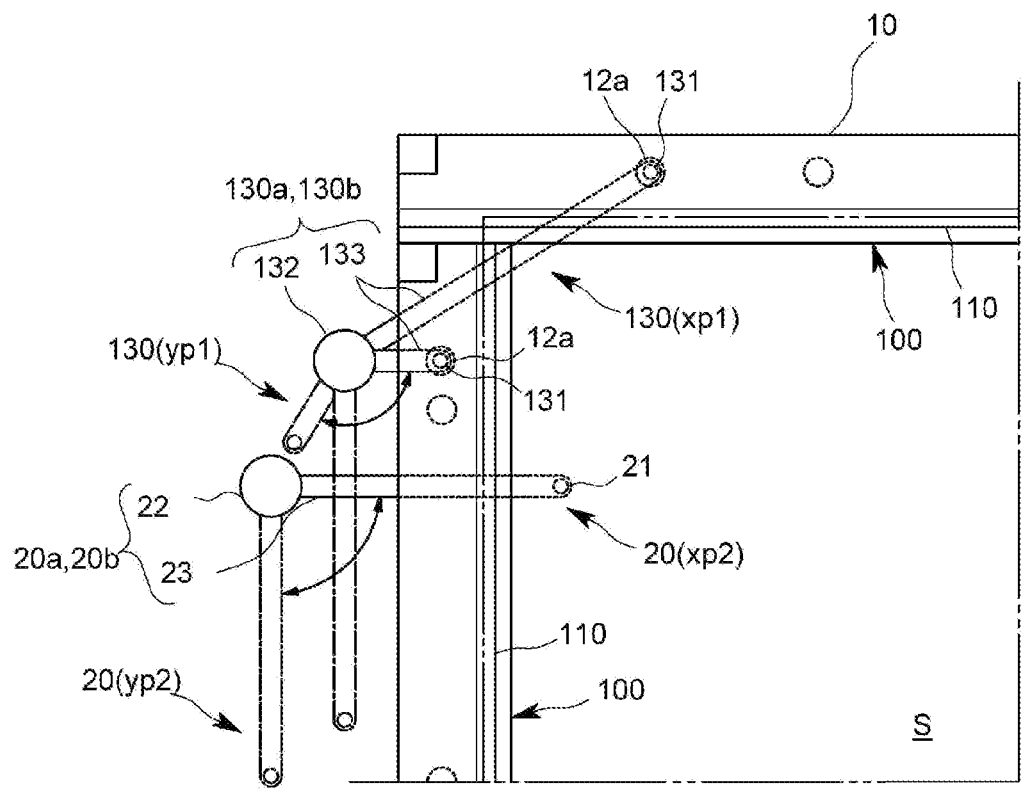
FIG. 5 is a partially enlarged plan view schematically showing the substrate holding device according to the embodiment.

As shown in FIG. 5, the clamp release mechanism 130 takes the clamp piece 110 in the closed state into an opened state with respect to the frame body 10. Specifically, the clamp release mechanism 130 includes push-up pins 131 which are arranged below each frame body 10 and are inserted into or extracted from the penetration holes 12a of each frame body 10, and a push-up pin advancing/retreating mechanism 130a and a push-up pin lifting/lowering mechanism 130b for driving the push-up pins 131. Moreover, in the embodiment, one clamp release mechanism 130 is provided with two push-up pins 131 below each of the frame bodies 10 arranged in two stages.

Specifically, the push-up pin advancing/retreating mechanism 130 advances and retreats (moves) between a push-up pin lifting/lowering position xp1 set on a lower side of the penetration hole 12a of the frame body 10 and a push-up pin retracting position yp1 set outside the frame body 10. In addition, the push-up pin lifting/lowering mechanism 130b lifts the push-up pin 131 arranged in the push-up pin lifting/lowering position xp1 by the push-up pin advancing/retreating mechanism 130a so as to insert the push-up pin 131 into the penetration hole 12a of the frame body 10 and push up the clamp piece 110, and then lowers the push-up pin 131.

Moreover, in the embodiment, the push-up pin advancing/retreating mechanism 130a and the push-up pin lifting/lowering mechanism 130b respectively include separate drive devices (not shown). Besides, the push-up pin advancing/retreating mechanism 130a and the push-up pin lifting/lowering mechanism 130b are configured to transmit operations of each drive device to each push-up pin 131 via a first support column 132 installed outside the frame body 10 and two arms 133 having a length extending from the first support column 132 to the push-up pin lifting/lowering position xp1. That is, the push-up pin advancing/retreating mechanism 130a and the push-up pin lifting/lowering mechanism 130b have structures in which separate drive devices are respectively included, and common members are used as the members (specifically, the first support column 132 and the first arms 133) for transmitting the power of the drive device to the push-up pins 131.

Besides, the push-up pin advancing/retreating mechanism 130a has a configuration in which each push-up pin 131 is swiveled between the push-up pin lifting/lowering position xp1 and the push-up pin retracting position yp1 by rotating the first support column 132 with the power of the drive device. In addition, the push-up pin lifting/lowering mechanism 130b has a configuration in which each push-up pin 131 is lifted and lowered, by lifting and lowering the first support column 132 with the power of the drive device, so as to be inserted into or extracted from the penetration hole 12a.

The substrate delivery mechanism 20 includes a support pin 21 which is arranged below the frame body 10 and is inserted into or extracted from an interior of the frame body 10, and a support pin advancing/retreating mechanism 20a and a support pin lifting/lowering mechanism 20b which drive the support pin 21. Moreover, in the embodiment, one substrate delivery mechanism 20 is provided with one support pin 21 below each of the frame bodies 10 arranged in two stages.

Specifically, the support pin advancing/retreating mechanism 20a advances and retreats between a support pin lifting/lowering position xp2 set on the lower side inside the frame body 10 and a support pin retracting position yp2 set outside the frame body 10. In addition, the support pin lifting/lowering mechanism 20b lifts the support pin 21 arranged in the support pin lifting/lowering position xp2 by the support pin advancing/retreating mechanism 20a so as to insert the support pin 21 into the interior of the frame body 10 and support the substrate S. and then lowers the support pin 21. Besides, when a size or the like of the substrate S is changed, the support position can be adjusted in accordance with the substrate S after the change by changing the support pin lifting/lowering position xp2.

Moreover, the support pin advancing/retreating mechanism 20a and the support pin lifting/lowering mechanism 20b respectively include separate drive devices. Besides, the support pin advancing/retreating mechanism 20a and the support pin lifting/lowering mechanism 20b are configured to transmit the operations of each drive device to each support pin 21 via a second support column 22 installed outside the frame body 10 and a second arm 23 having a length extending from the second support column 22 to the support pin lifting/lowering position xp2. That is, the support pin advancing/retreating mechanism 20a and the support pin lifting/lowering mechanism 20b have structures in which the separate drive devices are respectively included, and common members are used as the members (specifically, the second support column 22 and the second arm 23) for transmitting the power of the drive device to the support pin 21.

Therefore, the support pin advancing/retreating mechanism 20a has a configuration in which the support pin 21 is swiveled between the support pin lifting/lowering position xp2 and the support pin retracting position yp2 by rotating the second support column 22 with the power of the drive device. In addition, the support pin lifting/lowering mechanism 20b has a configuration in which each support pin 21 is lifted and lowered, by lifting and lowering the second support column 22 with the power of the drive device, so as to be inserted into or extracted from the interior of the frame body 10.

The frame body erecting mechanism 30 includes frame-shaped holders 31 holding the frame body 10, and a swivel mechanism 32 for swiveling the holder 31. Besides, the swivel mechanism 32 swivels the holders 31 between a horizontal state and a vertical state. Moreover, the holders 31 are arranged in a multi-stage shape with a number corresponding to the number of the frame bodies 10 and are arranged in a two-stage shape in the embodiment. In addition, for example, the holder 31 has a structure in which the frame body 10 can be inserted or removed between edges facing in the up-down direction in a vertically erected state.

In addition, the substrate holding device HD further has a control portion (not shown). Moreover, the control portion has a so-called computer including a CPU, a memory, an A/D or D/A converter and the like, and programs stored in the memory are executed, and each function is achieved by cooperation of various apparatuses. Specifically, the control portion exhibits a function of delivering the substrate S transferred by the transfer device TD to the frame body 10 by making the clamp release mechanism 130 cooperate with the substrate delivery mechanism 20.

Next, operations of the substrate holding device HD according to the present invention is described based on FIG. 2 and FIG. 6(a) to FIG. 6(e). Moreover, in FIG. 2 and FIG. 6(a) to FIG. 6(e), in order to simplify the drawings, with respect to the frame body 10, the operation of the substrate delivery mechanism 20 is shown on the left side, the operation of the clamp release mechanism 130s is shown on the right side, and only one push-up pin 131 of the two push-up pins 131 corresponding to one frame body 10 is shown in the clamp release mechanism 130.

Figure 6A:
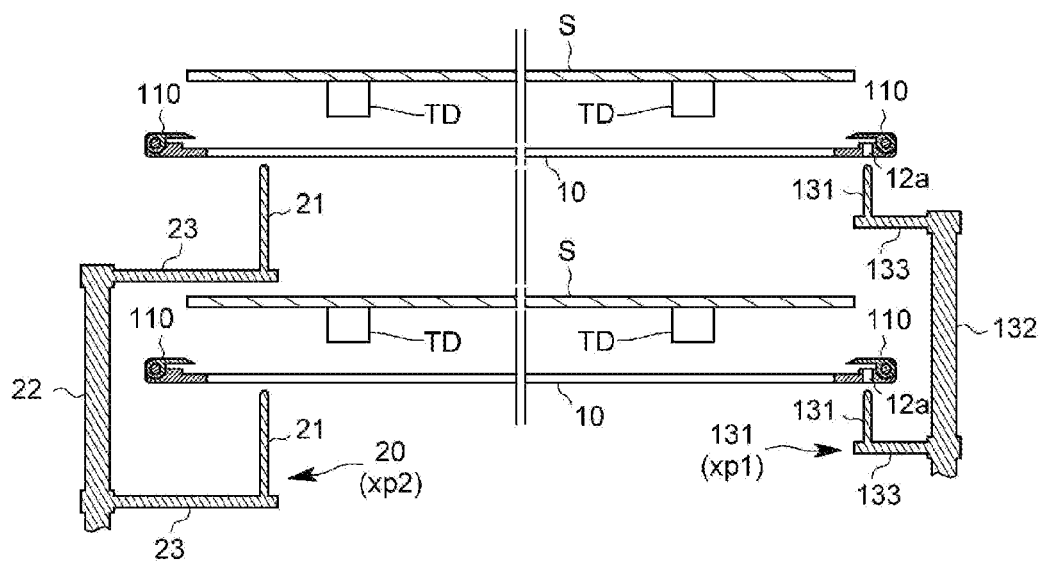
FIG. 6(a) to FIG. 6(e) are schematic views showing operations of the substrate holding device according to the embodiment.

First, as shown in FIG. 2, the frame bodies 10 are inserted into each of the holders 31 of the frame body erecting mechanism 30, and each frame body 10 is held in the horizontal state. In this state, as shown in FIG. 6(a), when the substrate S is transferred to the above of the frame body 10 by the transfer device TD, the control portion moves the support pin 21 to the support pin lifting/lowering position xp2 set on the lower side inside the frame body 10 by the support pin advancing/retreating mechanism 20a, and moves the push-up pin 131 to the push-up pin lifting/lowering position xp1 which is on the lower side of the penetration hole 12a of the frame body 10 by the push-up pin advancing/retreating mechanism 130a.

Figure 6B:
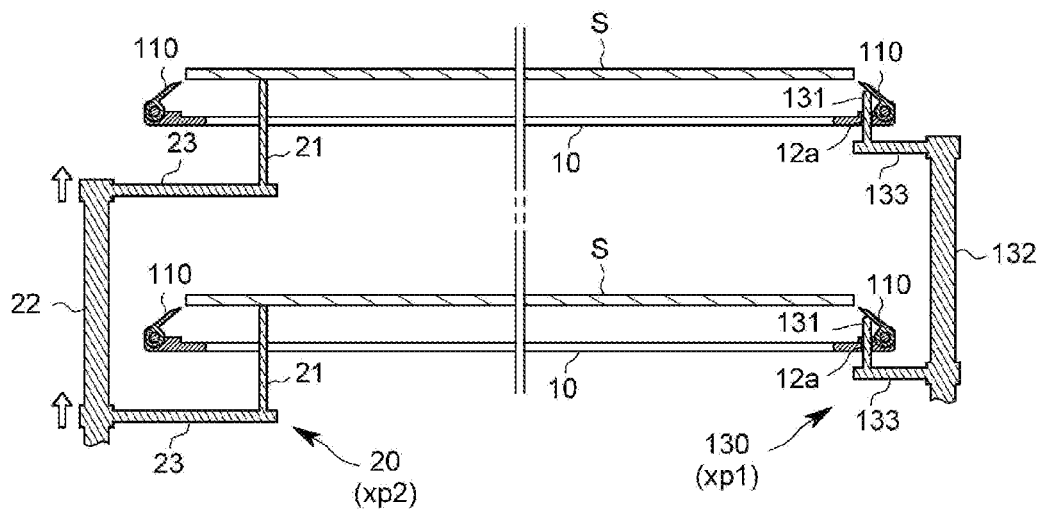

Next, as shown in FIG. 6(b), the control portion lifts the support pin 21 by the support pin lifting/lowering mechanism 20b in a manner that the support pin 21 passes through the interior of the frame body 10 from the lower side and supports the substrate S, and lifts the push-up pin 131 by the push-up pin lifting/lowering mechanism 130b in a manner that the push-up pin 131 is inserted into the penetration hole 12a and pushes up the clamp piece 110. Thereby, the substrate S is brought into a state of being supported from the lower side by the support pin 21, and the clamp piece 110 is brought into a state of being pushed up by the push-up pin 131 and being opened with respect to the frame body 10. Therefore, in this state, a state is attained in which the substrate S is delivered from the transfer device TD to the substrate delivery mechanism 20.

Figure 6C:
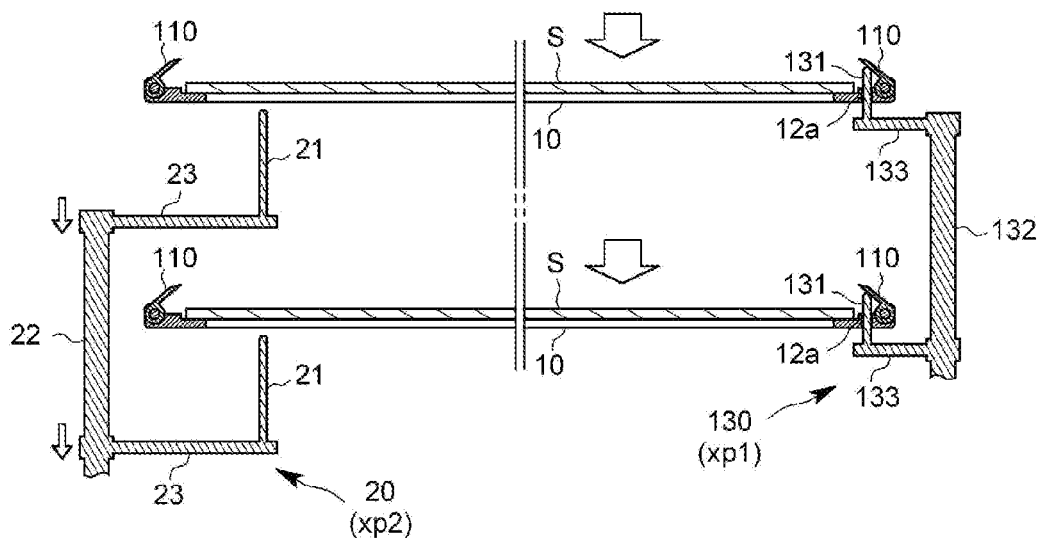

Next, as shown in FIG. 6(c), the control portion maintains the state in which the clamp piece 110 is pushed up by the push-up pin 131, and lowers the support pin 21 to the lower side inside the frame body 10 by the support pin lifting/lowering mechanism 20b. Thereby, the substrate S is delivered from the substrate delivery mechanism 20 to the frame body 10 while the support pin 21 is being lowered.

Figure 6D:
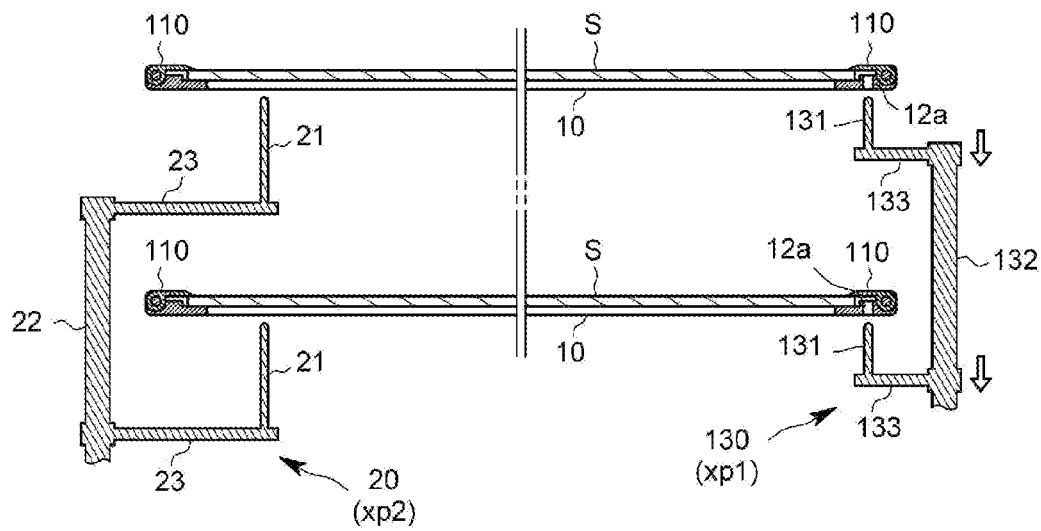

Next, as shown in FIG. 6(d), the control portion lowers the push-up pin 131 by the push-up pin lifting/lowering mechanism 130b so as to pull the push-up pin 131 out from the penetration hole 12a. Thereby, due to the own weight, the clamp piece 110 is brought into the closed state again with respect to the frame body 10. Moreover, in this state, the frame body 10 and the clamp piece 110 are attracted to each other with the magnetic force by the clamp holding mechanism 120, and thus the substrate S is brought into a state of being held on the frame body 10 with an appropriate force by each clamp mechanism 100.

Figure 6E:
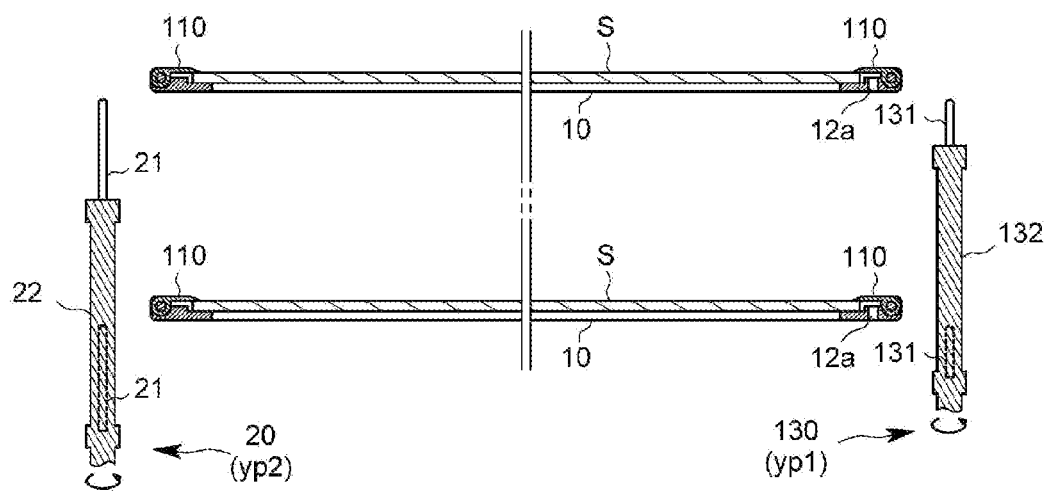

Then, as shown in FIG. 6(e), the control portion swivels the support pin 21 and moves the support pin 21 to the support pin retracting position yp2 set outside the frame body 10 by the support pin advancing/retreating mechanism 20a, and swivels the push-up pin 131 and moves the push-up pin 131 to the push-up pin retracting position yp1 set outside the frame body 10 by the push-up pin advancing/retreating mechanism 131a. Here, the support pin retracting position yp2 is the position where the support pin 21 does not hinder a subsequent movement of the frame body 10, and the push-up pin retracting position yp1 is the position where the push-up pin 131 does not hinder a subsequent movement of the frame body 10. In this state, as shown by a dotted line in FIG. 2, the frame body 10 held in the holder 31 is vertically erected by the swivel mechanism 32 of the frame body erecting mechanism 30.

After that, although it is not shown, each frame body 10 vertically erected by the frame body erecting mechanism 30 is extruded from the holder 31 by, for example, an extrusion mechanism. Then, each frame body 10 extruded from the holder 31 is alternately transferred to the processing chamber via a rail.

Moreover, the substrate delivery mechanism 20 may be configured in a manner that the support pin 21 is further lowered by the support pin lifting/lowering mechanism 20b after being moved to the support pin retracting position yp2 by the support pin advancing/retreating mechanism 20a. Similarly, the clamp release mechanism 130 may be configured in a manner that the push-up pin 131 is further lowered by the push-up pin lifting/lowering mechanism 130b after being moved to the push-up pin retracting position yp1 by the push-up pin advancing/retreating mechanism 130a. In this way, when the frame body 10 is vertically erected by the frame body erecting mechanism 30, a movable space of the frame body erecting mechanism 30 can be made wider.

In addition, when a force for clamping the substrate S by the clamp mechanism 100 is adjusted, as shown in FIG. 4, the distance of the magnet 121 with respect to the magnetic body 122 when the clamp piece 110 is in the closed state with respect to the frame body 10 is changed by the distance adjusting mechanism 140. Moreover, when the distance of the magnet 121 with respect to the magnetic body 122 is adjusted to be long, an attractive force due to the magnetic force is reduced, and thus the force for clamping the substrate S by the clamp mechanism 100 can be reduced; conversely, when the distance of the magnet 121 with respect to the magnetic body 122 is adjusted to be short, the attractive force due to the magnetic force increases, and thus the force for clamping the substrate S by the clamp mechanism 100 can be increased.

<Other embodiments> In the embodiment, the frame bodies 10 are installed in two stages, but the frame bodies 10 may also be installed in three or more stages. In addition, the frame body 10 may be installed in only one stage. In addition, in the embodiment, regarding one substrate delivery mechanism 20, one support pin 21 is correspondingly installed with respect to one frame body 10, but two or more support pins 21 may be correspondingly arranged with respect to one frame body 10.

In addition, in the embodiment, the support pin advancing/retreating mechanism 20a is a configuration that swivels and moves the support pin 21, but the support pin advancing/retreating mechanism 20a may also be a configuration that translates the support pin 21.

In addition, in the embodiment, the clamp holding mechanism 120 obtains, by attraction of the magnetic force, a force acting in a direction in which the clamp piece 110 is closed with respect to the frame body 10, but the present invention is not limited thereto, and the force may be obtained by, for example, mechanical means such as a spring and the like.

In addition, in the embodiment, the frame body 10 has a rectangular frame shape, but the frame body 10 in the present invention is not necessarily limited to be formed in the frame shape, and may have a structure in which the substrate S can be mounted thereon and a hole for the support pin 21 to pass through is opened.

In addition, the present invention is not limited to each embodiment described above, and it is clear that various modifications can be made within a range not deviating from the gist of the present invention.

What is claimed is:

1. A substrate holding device comprising:
   a frame body comprising a plurality of frame bodies, on which a substrate transferred by a transfer device is mounted; and
   a substrate delivery mechanism for delivering, to the frame body, the substrate transferred to a top of the frame body by the transfer device, wherein
   the substrate delivery mechanism comprises:
   a support pin arranged below the frame body;
   a support pin advancing/retreating mechanism comprising a rotating driver for advancing and retreating the support pin between a support pin lifting/lowering position set on a lower side inside the frame body and a support pin retracting position set outside the frame body; and
   a support pin lifting/lowering mechanism comprising a linear driver in which when the support pin is arranged in the support pin lifting/lowering position by the support pin advancing/retreating mechanism, the support pin is lifted or lowered so as to pass through an interior of the frame body and support the substrate,
   wherein the support pin advancing/retreating mechanism and the support pin lifting/lowering mechanism drive the support pin via a common support column installed outside the frame body and an arm having a length extending from the support column to at least the lifting/lowering position,
   the support pin advancing/retreating mechanism rotates the support column to swivel the support pin, and
   the support pin lifting/lowering mechanism lifts and lowers the support column to lift and lower the support pin,
   wherein the plurality of frame bodies are arranged in a multi-stage shape, and
   wherein the support pin comprises a plurality of support pins, the support pins are arranged below each of the frame bodies.

2. The substrate holding device according to claim 1, wherein the support pins arranged below each frame body of the plurality of frame bodies are driven by the support pin advancing/retreating mechanism and the support pin lifting/lowering mechanism in common.

3. The substrate holding device according to claim 1, further comprising a frame body erecting mechanism for vertically erecting each frame body of the plurality of frame bodies on which the substrate is mounted.

4. The substrate holding device according to claim 1, wherein the support pin advancing/retreating mechanism swivels the support pin in a horizontal direction.

5. The substrate holding device according to claim 1, wherein the frame body further comprises a clamp mechanism for clamping and holding the substrate mounted on at least one frame body of the plurality of frame bodies between the clamp mechanism and the at least one frame body.

6. The substrate holding device according to claim 5, wherein the clamp mechanism comprises: a clamp piece which opens and closes so as to clamp the substrate mounted on the at least one frame body between the clamp piece and the at least one frame body; and a clamp holding mechanism for holding the clamp piece in a closed state with respect to the at least one frame body.

7. The substrate holding device according to claim 6, wherein the clamp holding mechanism comprises a magnet arranged on either the at least one frame body or the clamp piece and a magnetic body arranged on the other of either the at least one frame body or the clamp piece.

8. The substrate holding device according to claim 6, wherein the clamp mechanism further comprises a clamp release mechanism for releasing the closed state of the clamp piece with respect to the at least one frame body.

9. The substrate holding device according to claim 8, wherein the at least one frame body has a penetration hole, and the clamp release mechanism further comprises: a push-up pin arranged below the at least one frame body; a push-up pin advancing/retreating mechanism comprising a rotating driver for advancing and retreating the push-up pin between a push-up pin lifting/lowering position set on a lower side of the penetration hole of the at least one frame body and a push-up pin retracting position set outside the at least one frame body; and a push-up pin lifting/lowering mechanism comprising a linear driver which lifts the push-up pin arranged in the push-up pin lifting/lowering position by the push-up pin advancing/retreating mechanism so as to insert the push-up pin into the penetration hole of the at least one frame body and push up the clamp piece, and then lowers the push-up pin, wherein the push-up pin advancing/retreating mechanism and the push-up pin lifting/lowering mechanism drive the push-up pin via a common support column installed outside the at least one frame body and an having a length extending from the support column to at least the lifting/lowering position, the push-up pin advancing/retreating mechanism rotates the support column to swivel the push-up pin, and the push-up pin lifting/lowering mechanism lifts and lowers the support column to lift and lower the push-up pin.

* * * * *